United States Patent
Moder et al.

(10) Patent No.: US 12,412,740 B2
(45) Date of Patent: *Sep. 9, 2025

(54) SEMICONDUCTOR DEVICE WITH A POROUS PORTION, WAFER COMPOSITE AND METHOD OF MANUFACTURING A SEMICONDUCTOR DEVICE

(71) Applicant: Infineon Technologies AG, Neubiberg (DE)

(72) Inventors: Iris Moder, Villach (AT); Bernhard Goller, Villach (AT); Tobias Franz Wolfgang Hoechbauer, Villach (AT); Roland Rupp, Lauf (DE); Francisco Javier Santos Rodriguez, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/407,025

(22) Filed: Jan. 8, 2024

(65) Prior Publication Data

US 2024/0153759 A1 May 9, 2024

Related U.S. Application Data

(60) Continuation of application No. 17/869,524, filed on Jul. 20, 2022, now Pat. No. 11,881,397, which is a
(Continued)

(30) Foreign Application Priority Data

Mar. 6, 2019 (DE) .......................... 102019105677.2
Apr. 3, 2019 (DE) .......................... 102019108754.6

(51) Int. Cl.
*H01L 21/00* (2006.01)
*H01L 21/02* (2006.01)
(Continued)

(52) U.S. Cl.
CPC .... *H01L 21/02203* (2013.01); *H01L 21/0203* (2013.01); *H01L 21/02293* (2013.01);
(Continued)

(58) Field of Classification Search
CPC ............ H01L 21/0203; H01L 21/0271; H01L 21/033; H01L 21/467; H01L 21/475
See application file for complete search history.

(56) References Cited

U.S. PATENT DOCUMENTS 11,476,111 B2 * 10/2022 Moder ................. H01L 21/475
2002/0153595 A1 10/2002 Tayanaka
2017/0154808 A1 6/2017 Moder et al.

FOREIGN PATENT DOCUMENTS

CN 1516293 A 7/2004
WO 2013117155 A1 8/2013

* cited by examiner

*Primary Examiner* — Reema Patel
(74) *Attorney, Agent, or Firm* — Cooper Legal Group LLC

(57) ABSTRACT

A semiconductor substrate includes a base portion, an auxiliary layer and a surface layer. The auxiliary layer is formed on the base portion. The surface layer is formed on the auxiliary layer. The surface layer is in contact with a first main surface of the semiconductor substrate. The auxiliary layer has a different electrochemical dissolution efficiency than the base portion and the surface layer. At least a portion of the auxiliary layer and at least a portion of the surface layer are converted into a porous structure. Subsequently, an epitaxial layer is formed on the first main surface.

20 Claims, 8 Drawing Sheets

Related U.S. Application Data division of application No. 16/811,192, filed on Mar. 6, 2020, now Pat. No. 11,476,111.

(51) Int. Cl.
    *H01L 21/467*     (2006.01)
    *H01L 21/475*     (2006.01)
    *H01L 21/4757*     (2006.01)
    *H10D 12/00*     (2025.01)
    *H10D 30/66*     (2025.01)

(52) U.S. Cl.
    CPC ...... *H01L 21/02378* (2013.01); *H01L 21/467* (2013.01); *H01L 21/475* (2013.01); *H01L 21/47576* (2013.01); *H10D 12/441* (2025.01); *H10D 30/66* (2025.01)

SEMICONDUCTOR DEVICE WITH A POROUS PORTION, WAFER COMPOSITE AND METHOD OF MANUFACTURING A SEMICONDUCTOR DEVICE

RELATED APPLICATIONS

This application claims priority to and is a continuation of U.S. application Ser. No. 17/869,524, filed on Jul. 20, 2022, entitled "SEMICONDUCTOR DEVICE WITH A POROUS PORTION, WAFER COMPOSITE AND METHOD OF MANUFACTURING A SEMICONDUCTOR DEVICE", which claims priority to and is a divisional of U.S. application Ser. No. 16/811,192, filed on Mar. 6, 2020, entitled "SEMICONDUCTOR DEVICE WITH A POROUS PORTION, WAFER COMPOSITE AND METHOD OF MANUFACTURING A SEMICONDUCTOR DEVICE", which claims priority to German Patent Application No. 102019105677.2, filed on Mar. 6, 2019, entitled "SEMICONDUCTOR DEVICE WITH A POROUS PORTION, WAFER COMPOSITE AND METHOD OF MANUFACTURING A SEMICONDUCTOR DEVICE", and German Patent Application No. 102019108754.6, filed on Apr. 3, 2019, entitled "SEMICONDUCTOR DEVICE WITH A POROUS PORTION, WAFER COMPOSITE AND METHOD OF MANUFACTURING A SEMICONDUCTOR DEVICE". U.S. application Ser. No. 17/869,524, U.S. application Ser. No. 16/811,192, German Patent Application No. 102019105677.2 and German Patent Application No. 102019108754.6 are all incorporated by reference herein in their entirety.

TECHNICAL FIELD

Examples of the present disclosure relate to a method of manufacturing semiconductor devices, wherein the method includes forming a porous structure in a semiconductor substrate. Further examples refer to a wafer composite with a porous structure and to a semiconductor device including a porous portion.

BACKGROUND

Fabrication of semiconductor wafers typically includes forming crystal ingots by vertical zone melting or by pulling a seed crystal rod from a crucible filled with molten semiconductor material. Then the crystal ingots are sliced, e.g., by sawing. Meanwhile, several techniques obtain epitaxial silicon wafers by forming a thin release layer on top of a re-usable silicon seed wafer, epitaxially growing a silicon layer on the release layer and then mechanically detaching the epitaxial grown silicon layer from the seed wafer. Other methods split off an epitaxially grown semiconductor wafer from a single-crystalline base substrate along a cleavage layer that may be formed by laser radiation.

There is a need for methods for providing semiconductor wafers in an economic way.

SUMMARY

An embodiment of the present disclosure relates to a method of manufacturing a semiconductor device. The method includes providing a semiconductor substrate that includes a base portion, an auxiliary layer and a surface layer. The auxiliary layer is formed on the base portion. The surface layer is formed on the auxiliary layer. The surface layer is formed in contact with a first main surface of the semiconductor substrate. The auxiliary layer may have a different electrochemical dissolution efficiency than the base portion and the surface layer. At least a portion of the auxiliary layer and at least a portion of the surface layer are converted into a porous structure. After converting at least the portion of the auxiliary layer and at least the portion of the surface layer into the porous structure, an epitaxial layer is formed on the first main surface.

An embodiment of the present disclosure relates to a method of manufacturing a semiconductor device. A semiconductor substrate is provided that includes a base portion and an auxiliary layer formed on the base portion. The auxiliary layer is in contact with a first main surface of the semiconductor substrate. Pits are formed in the first main surface and/or the auxiliary layer. At least a portion of the auxiliary layer is converted into a porous structure, wherein the porous structure includes a layered portion at a distance to the first main surface and further includes laterally separated columnar portions extending from the pits to the layered portion.

An embodiment of the present disclosure relates to a wafer composite that includes a base portion, a porous structure and an epitaxial layer. The porous structure includes a coarse-porous layered portion formed on the base portion and a fine-porous portion formed on the layered portion. The epitaxial layer is formed on the fine-porous portion.

An embodiment of the present disclosure relates to a semiconductor device that includes a semiconductor body. The semiconductor body includes a drift structure, a fine-pored portion and a coarse-pored layered portion. The fine-pored portion is formed between a first surface of the semiconductor body and the coarse-pored layered portion. The coarse-pored layered portion is in contact (e.g., direct contact) with a second surface of the semiconductor body opposite to the first surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device, a wafer composite and a method of manufacturing a semiconductor device and together with the description serve to explain principles of the embodiments. Further embodiments are described in the following detailed description and the claims.

DETAILED DESCRIPTION

Figure 1A:
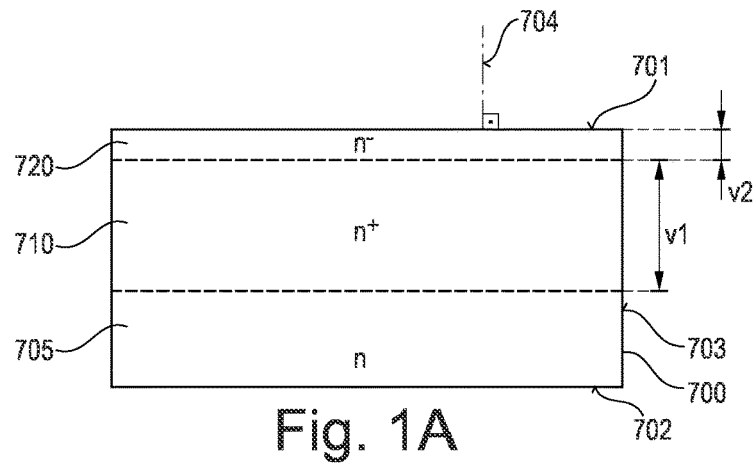
FIGS. 1A-1D show schematic vertical cross-sectional views of portions of a semiconductor substrate and a wafer composite for illustrating a semiconductor device manufacturing method that includes forming a porous structure according to an embodiment.

In the following detailed description, reference is made to the accompanying drawings, which form a part hereof and in which are shown by way of illustrations specific embodiments in which a semiconductor device, a wafer composite and a method of manufacturing a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction with a linear or almost linear current-voltage characteristic.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

According to an embodiment, a method of manufacturing a semiconductor device may include providing a semiconductor substrate that includes a base portion, an auxiliary layer and a surface layer.

The semiconductor substrate may be a semiconductor single-crystal, wherein the semiconductor may be a single-element semiconductor such as silicon (Si) or germanium (Ge) or a compound semiconductor, for example a III/V compound semiconductor such as gallium arsenide (GaAs) or gallium nitride (GaN) or a IV/IV compound semiconductor such as silicon germanium (SiGe) or silicon carbide (SiC). The semiconductor substrate may have two parallel, flat main surfaces of the same shape and size and a lateral surface area connecting the edges of the two main surfaces. For example, the semiconductor substrate may be a polygonal (e.g., a rectangular or a hexagonal) prism with or without rounded edges or a right cylinder with or without one or more flats or notches.

Directions parallel to the main surfaces are horizontal or lateral directions. A surface normal on a main surface is parallel to a vertical direction.

The auxiliary layer may be formed on the base portion (e.g., the auxiliary layer may be formed directly on the base portion). The surface layer may be formed on the auxiliary layer (e.g., the surface layer may be formed directly on the auxiliary layer). In other words, the base portion, the auxiliary layer and the surface layer may be vertically stacked upon each other (e.g., the base portion, the auxiliary layer and the surface layer may be vertically stacked directly upon each other). The surface layer may be the topmost layer and the exposed surface of the surface layer may form a first one of the two main surfaces of the semiconductor substrate. The surface layer may comprise a first main surface of the semiconductor substrate. For example, the surface layer may be formed in contact (e.g., direct contact) with the first main surface. For example, an outer surface of the surface layer may form and/or constitute the first main surface.

The base portion and the auxiliary layer may form a horizontal first interface, e.g., a horizontal unipolar junction or a pn junction. The base portion and the surface layer may form a horizontal second interface, e.g., a horizontal unipolar junction or a pn junction. Here and in the following, a layer may be understood as a horizontal structure of a substantially uniform thickness and laterally substantially uniform dopant distribution.

The auxiliary layer may have a different electrochemical dissolution efficiency (e.g., a higher dissolution efficiency) than the base portion and/or the surface layer. Anodic dissolution occurs during electrochemical etching, wherein a metal or semiconductor dissolves from an anodic workpiece in a cathodic electrolyte. The electrochemical dissolution efficiency may correspond to the amount of material that can be removed with electrochemical etching under the same conditions, for example with the current or the voltage kept constant. A higher electrochemical dissolution efficiency may result in a coarser pore structure with greater pores.

The electrochemical dissolution efficiency may correspond to the electrochemical dissolution rate, for example, the anodic dissolution rate. Alternatively and/or additionally, the electrochemical dissolution efficiency may correspond to the time the electrochemical etching affects the respective portion and/or layer that is to be etched. The electrochemical dissolution rate may be the amount of atoms removed during a given time period. For example, the auxiliary layer may have a higher electrochemical dissolution efficiency than the base portion and/or the surface layer.

In some embodiments, the electrochemical dissolution rate of the auxiliary layer may be higher than the electrochemical dissolution rate of the base portion and/or the surface layer. For example, this may be the case for the so-called voltage-driven electrochemical etching (i.e., when applying a constant voltage). The electrochemical dissolution rate is the rate at which a certain material dissolves in an electrolyte. In the voltage-driven case, a more conductive portion of a semiconductor material may have a higher electrochemical dissolution rate than a less conductive portion of the same semiconductor material with the same conductivity type. For example, in the voltage-driven case, a more heavily doped portion of a semiconductor material may exhibit a higher electrochemical dissolution rate than a more lightly doped portion of the same semiconductor material with the same conductivity type.

In other embodiments, the electrochemical dissolution rate of the auxiliary layer may be equal to or higher than the electrochemical dissolution rate of the base portion and/or the surface layer. For example, this may be the case for the so-called current-driven electrochemical etching. In this case, the electrochemical etching may affect the auxiliary layer for a longer time than the surface layer and/or the base portion. It may be possible that the electrochemical etching will (e.g., automatically) stop earlier for the base portion and/or the surface layer due to, for example, different electrical properties of these layers (or this layer, respectively) compared to the auxiliary layer. This way, more material may be removed from the auxiliary layer compared to the base portion and/or the surface layer.

Embodiments may exist where the electrochemical dissolution rate of the auxiliary layer may be even lower than the electrochemical dissolution rate of the base portion and/or the surface layer.

During electrochemical etching of a substrate with uniform dissolution rate, the electric resistance of the semiconductor substrate may be locally reduced at locations at which due to natural fluctuations the etching starts to proceed. The lower electrical resistance results in a higher local current density and current filaments such that the etching predominantly proceeds at locations where the etching has started first due to natural fluctuations. The embodiments may improve the control of the access of the etching medium to the auxiliary layer and replace to some degree a purely stochastic process.

At least a portion of the auxiliary layer and a portion of the surface layer may be electrochemically porosified, i.e., converted (and/or transformed) into a porous structure, e.g., by electrochemical etching that induces anodic dissolution of the semiconductor material. For example, the semiconductor substrate may get into contact with an electrolyte containing fluorine, for example, hydrofluoric acid (HF), and ethanol. Alternatively and/or additionally, the electrolyte may be an aqueous HF solution. A cathode electrode may be immersed into the electrolyte and an electric potential may be applied between the cathode electrode and the semiconductor substrate, which forms the anode electrode.

Rather than dissolving the crystal structure of the semiconductor substrate completely, anodic dissolution locally excavates groups of lattice atoms from the crystal lattice, wherein pores form within the semiconductor crystal. The residual non-dissolved lattice atoms form a single-crystalline lattice skeleton.

The anodic dissolution may convert at least a portion of the auxiliary layer and at least a portion of the surface layer into a porous portion. The higher dissolution efficiency of the auxiliary layer may cause the anodic dissolution to convert at least the portion of the auxiliary layer into a coarse-porous portion with comparatively large pores and a high overall porosity of at least 30% and at most 80%, e.g., in a range from 40% to 60% (e.g., the anodic dissolution may convert at least the portion of the auxiliary layer into the coarse-porous portion due to the higher anodic dissolution efficiency of the auxiliary layer). For example, in the coarse-porous portion the pores may have a mean diameter greater than 50 nm, e.g., in a range from 50 nm to 200 nm.

The low anodic dissolution efficiency of the surface layer may cause the anodic dissolution to convert at least the portion of the surface layer into a fine-porous portion with comparatively small pores and a low overall porosity of at least 5% and at most 50%, e.g., in a range from 10% to 35% (e.g., the anodic dissolution may convert at least the portion of the surface layer into the fine-porous portion due to the low anodic dissolution efficiency of the surface layer). For example, in the fine-porous portion the pores may have a mean diameter of at most 50 nm, e.g., smaller than 40 nm.

The porosity of the coarse-porous portion may, in general, be larger than the porosity of the fine-porous portion. The porosity of a portion (e.g., a layer or a body) may be the fraction of the void (i.e., "empty") volume in the portion over the total volume of said portion.

The auxiliary layer may be porosified across the complete vertical extension of the auxiliary layer. In addition, a horizontal layer portion of the base portion may be porosified, wherein the porosified horizontal layer portion of the base portion is in contact (e.g., direct contact) with the porosified auxiliary layer. Alternatively and/or additionally, only a horizontal layer portion of the auxiliary layer may be porosified, wherein the porosified horizontal layer portion may adjoin (e.g., directly adjoin) the porosified surface layer.

After forming the porous structure via conversion, an epitaxial layer may be formed on (e.g., directly on) the first main surface of the surface layer (with or without pre-epitaxial growth in-situ hydrogen surface etch). The deposited atoms may lock into the porous, but still crystalline (e.g., single-crystalline), lattice of the porous structure. The epitaxial layer may be formed from the same semiconductor as the surface layer or from another semiconductor that forms a crystal lattice approximately matching with the crystal lattice of the surface layer.

The quality of the epitaxial layer can be described by its lattice defect density. An epitaxial layer grown on a coarse-porous (also called "large-porous") structure may show a comparatively high lattice defect density. In some semiconductor materials, anodic dissolution may form a thin surface layer (so-called skin layer) with self-ordered columnar pores and a comparatively fine-porous structure. Such a natural skin layer may be too thin to provide a sufficiently rugged seed layer for epitaxy. For example, a cleaning or etch process, e.g., an etch process in an atmosphere containing hydrogen may precede the epitaxy process and may partly or completely convert the natural skin layer into a porous structure with greater and/or more pores.

The presence of the surface layer facilitates control of the thickness of a sufficiently rugged seed layer for epitaxy, wherein the seed layer has a fine-porous structure along the first main surface and wherein the seed layer includes the surface layer or at least a portion of the surface layer.

In some examples, selecting a suitable thickness for the surface layer facilitates the formation of a fine-porous seed layer of defined thickness along the first main surface and formation of a coarse-porous layer at a distance to the first main surface. The seed layer may provide a suitable base for an epitaxial layer with comparatively high crystal quality. The thickness of the seed layer may be sufficient to be not completely consumed or otherwise damaged in or before (e.g., directly before) the epitaxy process. At the same time, the method provides a highly porous structure below the fine-porous seed layer. The highly porous structure may facilitate, for example, a reliable separation process that releases the epitaxial layer from the base portion.

For example, the wafer may additionally undergo a high-temperature treatment (e.g., an activating anneal or after epitaxial growth). The high-temperature treatment may be performed at a temperature of above 1300° C. During such a high-temperature treatment, the pores in the porous structure may be rearranged within the semiconductor material. In particular, the pores may be combined and/or rearranged to larger pores. The porosity of the porous structure may remain unchanged or may change only by at most ±10%. For example, after the high-temperature treatment, the porous structure may have larger pores, but the number of pores may have been reduced. The morphology of the porous structure may thus change during high-temperature treatment. This could facilitate separation of the epitaxial layer from the base portion.

According to an embodiment, the epitaxial layer may be separated from the base portion along the porous structure at any later stage of processing. For example, the epitaxial layer may be separated from the base portion after forming semiconducting portions of semiconductor devices in the epitaxial layer. The separation process may include separating (e.g., cleaving) the porous structure along an approximately horizontal plane through the coarse-porous layered portion.

The method facilitates obtaining semiconductor devices exclusively from an epitaxial layer (e.g., several epitaxial layers with different doping). The base portion may be reused for a further cycle after removing residuals of the porous structure from the base portion. Since the auxiliary layer can be thinner than a typical sawing blade or even a wire for sawing semiconductor wafers from a crystal ingot, it is possible to reduce the loss of expensive single-crystalline semiconductor material.

According to an embodiment, the epitaxial layer and the semiconductor substrate may differ in at least one main constituent. For example, the epitaxial layer may be a layer of gallium arsenide (GaAs) or gallium nitride (GaN) and the semiconductor substrate may be a silicon carbide (SiC) substrate. More expensive semiconductor material can be obtained by epitaxial growth at the expense of loss of less expensive semiconductor material.

According to an embodiment, a mean net dopant concentration in the auxiliary layer can be at least at 100 times a mean net dopant concentration in the surface layer. For example, the surface layer and the auxiliary layer are based on n-type 4H-SiC and the dopant concentration in the auxiliary layer may be greater than $10^{19}$ cm$^{-3}$, for example, at least $10^{20}$ cm$^{-3}$. The dopant concentration in the surface layer may be lower than $10^{18}$ cm$^{-3}$, for example, at most $10^{17}$ cm$^{-3}$.

In addition, a mean net dopant concentration in the base portion may be equal to or may be at most 50%, for example, at most 10%, of the mean net dopant concentration in the auxiliary layer. In this way, the vertical growth of the porous structure into the direction of the second main surface may be controlled.

According to an embodiment, the surface layer and the auxiliary layer may have the same conductivity type, for example, both layers may be n-type or p-type. The surface layer may thus be formed in a cost-effective way. For example, formation of the surface layer may include in-situ doping during epitaxial growth of the surface layer on the auxiliary layer. Alternatively and/or additionally, formation of the surface layer may include counterdoping a surface portion of a precursor layer with the dopant concentration of the auxiliary layer, wherein the counter-doped portion of the precursor layer forms the surface layer and the rest of the precursor layer forms the auxiliary layer.

According to an embodiment, the semiconductor substrate may be a silicon carbide substrate. Porosification of a silicon carbide substrate without formation of an auxiliary layer and a surface layer can result in a comparatively thin natural skin layer in which self-ordered nanocolumnar pores form. The natural skin layer can show a sufficiently smooth surface for epitaxial growth. Providing the combination of surface layer and auxiliary layer according to some embodiments of the present method can result in that after porosification the surface layer or a portion of the surface layer forms a seed layer with a greater thickness than the natural skin layer, wherein the seed layer is more robust and not consumed or heavily damaged during the epitaxial growth of the epitaxial layer.

According to an embodiment, the first main surface may be completely exposed during formation of the porous structure. A sufficiently thick surface layer may be formed in an economic way without any further masking acts.

According to an embodiment, a mask may be formed on the main surface prior to forming the porous structure via the conversion. Mask openings in the mask may expose first sections of the surface layer. The mask openings may be stripe-shaped with a width of not more than 200 nm, for example at most 100 nm, or may be approximately circular or approximately regular polygonal with a diameter or edge length of not more than 200 nm, for example, at most 100 nm. The mask openings may be arranged in a regular pattern, wherein a center-to-center distance between neighboring mask openings may be in the range of several micrometers. The mask may be formed from a material with sufficient etch resistance against the electrolyte.

During electrochemical etching, the electric field may concentrate in (i.e., may be largest in and/or may dominate in) portions of the surface layer below the mask openings. In other words, in the lightly doped surface layer, the porosification will concentrate along the electric field lines below the mask openings such that no or only few pores are formed in portions of the surface layer covered by the mask. The non-porosified portions of the surface layer may form defect-free portions of a seed layer for a high-quality epitaxial layer.

The dopant concentrations in the surface layer and the auxiliary layer, the thickness of the surface layer, the dimensions of the mask openings and the center-to-center distance between the mask openings facilitate precise control of the thickness of a rugged seed layer for the epitaxial process.

According to an embodiment, the first sections exposed by the mask openings may be recessed prior to forming the porous structure via the conversion. The recess may form pits in the first main surface. The pits may have a vertical extension in a range from 0.1 µm to 5 µm, for example from 0.5 µm to 1 µm.

The mask may be removed prior to porosification (i.e., prior to forming the porous structure). During anodic etching, the electric field lines may concentrate below the pits. Anodic dissolution may concentrate and propagate along current filaments that form parallel to the electric field lines below the pits such that in the surface layer pores are predominantly or exclusively formed below the pits. Non-porosified portions of the surface layer may form portions of a rugged seed layer for epitaxial growth.

According to an embodiment, prior to forming the porous structure via the conversion, dopants may be implanted selectively into the first sections. The dopants may locally increase the electrochemical dissolution efficiency, e.g., the dissolution rate of the surface layer such that in the lightly-doped surface layer porosification takes place predominantly in the portions exposed by the mask openings. Non-porosified portions of the surface layer may form portions of a rugged seed layer for epitaxial growth.

According to an embodiment, the method of manufacturing a semiconductor device includes providing a semiconductor substrate that includes a base portion and an auxiliary layer formed on the base portion. Pits may be formed in the auxiliary layer. For example, an etch mask may be formed on the auxiliary layer, wherein mask openings in the etch mask expose first sections of the auxiliary layer and wherein the pits are formed in the first sections. The pits may have a vertical extension in a range from 0.1 µm to 5 µm, for example from 0.5 µm to 1 µm. A first vertical extension v1 of the auxiliary layer may be in a range from 0.5 µm to 10 µm.

At least a portion of the auxiliary layer may be converted (and/or transformed) into a porous structure, e.g., by anodic dissolution. The porous structure includes a layered portion at a distance to the main surface and laterally separated columnar portions extending from the pits to the layered portion. Non-porosified portions of the auxiliary layer between the columnar portions form non-porous portions. The non-porous portions may be completely without pores or may include pores to a significant lower extent than the columnar portions of the porous structure. For example, a porosity of the non-porous portion is at most 10% of the porosity of the columnar portions.

The pits allow formation of a sufficiently thick, low-porous seed layer with sufficient crystal quality at low effort.

According to an embodiment, after converting at least a portion of the auxiliary layer and at least a portion of the surface layer into the porous structure, an epitaxial layer may be formed on the first main surface. The epitaxial layer may be separated from the base portion along the layered portion of the porous structure. For example, the layered portion may be horizontally separated.

According to an embodiment, a wafer composite may include a base portion, a porous structure and an epitaxial layer. The porous structure may include a coarse-porous layered portion and a fine-porous portion. The coarse-porous layered portion is formed on the base portion. The fine-porous portion is formed on the coarse-porous layered portion. The epitaxial layer is formed on the fine-porous portion. The epitaxial layer may be homogenously doped, may show a non-uniform vertical dopant gradient, may include two or more differently doped sublayers or may include semiconducting portions of semiconductor devices at any stage of processing.

The wafer composite facilitates the manufacturing of semiconductor devices in an epitaxial layer with high crystal quality, wherein the porous structure facilitates effective separation of the epitaxial layer from the base portion.

According to an embodiment, the fine-porous portion may include laterally separated columnar portions that protrude from the layered portion. Non-porous portions may be formed laterally between the columnar portions.

According to an embodiment, the layered portion may include a compound semiconductor.

According to an embodiment a semiconductor device may include a semiconductor body that includes a drift structure, a fine-pored portion and a coarse-pored layered portion.

The semiconductor device and/or the wafer described above may have been produced with at least some of the method acts described in connection with embodiments above or below. For example, all features disclosed in connection with embodiments of the method are also disclosed for the semiconductor device and/or the wafer and vice versa. In some examples, the fine-pored portion may have the characteristics of the fine-porous portion described above. Alternatively and/or additionally, the coarse-pored portion may have the characteristics of the coarse-porous portion described above and a layer portion of the coarse-pored portion may have the characteristics of the layered portion of the coarse-porous portion described above.

The fine-pored portion may be formed between the first surface and the layer portion of the coarse-pored portion. The coarse-pored layer portion may be in contact (e.g., direct contact) with the second surface. The drift structure may include a lightly doped drift zone between the first surface and the porous portion. The drift zone may be formed outside the porous portion or may overlap with the porous portion, e.g., with the fine-pored portion. The fine-pored portion may be in contact (e.g., direct contact) with the layer portion.

The semiconductor device may be formed in a cost-effective way exclusively in epitaxial material that may be separated from a donor substrate along a porous structure, wherein the fine-pored portion and the layer portion of the semiconductor device may be formed from portions of the porous structure. The fine-pored portion and the coarse-pored layer portion may reduce mechanical stress between a semiconductor body and a rear side metallization formed on the second surface. Alternatively and/or additionally, the fine-pored portion and the layer portion may provide getter sites for impurities, e.g. metal atoms and/or may be used to tune device parameters such as short-circuit ruggedness. Alternatively and/or additionally, the fine-pored portion and the coarse-pored portion may increase the charge-carrier recombination rate for improving switching characteristics of a semiconductor device and/or may improve adhesion between the semiconductor body and a non-semiconductor material on the second surface.

According to an embodiment, the fine-pored portion may include laterally separated column portions that protrude from the layer portion. For example, the column portions may be stripe-shaped with a horizontal longitudinal axis parallel to the first surface. Alternatively and/or additionally, the column portions may have two orthogonal horizontal dimensions within the same order of magnitude. For example, the horizontal cross-sections of the column portions may be circular or polygonal with or without rounded corners. The fine-porous column portions may locally increase the charge-carrier recombination rate for improving switching characteristics of a semiconductor device.

According to an embodiment, the semiconductor device includes a rear side metallization which is in contact (e.g., direct contact) with the layer portion. The coarse-pored layer portion may reduce thermo-mechanical stress between the semiconductor body and the rear side metallization.

Alternatively and/or additionally, the coarse-pored layer portion may reduce the contact resistance between the backside metallization and the semiconductor backside surface.

According to an embodiment, the layer portion may include a compound semiconductor, for example, a IV/IV compound semiconductor, e.g., SiC.

FIGS. 1A-1D illustrate formation of an epitaxial wafer separable from a donor wafer by horizontally separating (e.g., cleaving) a porous structure.

FIG. 1A shows a semiconductor substrate 700 which may be a slice of a non-porous single-crystalline semiconductor crystal. The semiconductor substrate 700 may be obtained from a single-crystalline ingot, e.g., by sawing, or may be obtained by epitaxy.

A first main surface 701 at the front side of the semiconductor substrate 700 and a second main surface 702 at the rear side are parallel to each other and may have the same size and the same shape, which may be circular, circular with notch, circular with flat, polygonal with rounded corners, or polygonal without rounded corners. A lateral surface area 703 connects the edges of the first main surface 701 and the second main surface 702.

The semiconductor of the semiconductor substrate 700 may be an element semiconductor such as silicon or germanium or may be a compound semiconductor, for example, a IV/IV compound semiconductor such as 15R-SiC, 2H-SiC, 6H-SiC or 4H-SiC. In addition to the main constituents silicon and carbon, the semiconductor substrate 700 may include dopant atoms, for example nitrogen (N), phosphorus (P), beryllium (Be), aluminum (Al), and/or gallium (Ga). The semiconductor substrate 700 may include further impurities, such as a hydrogen (H), fluorine (F) and/or oxygen (O).

A surface normal 704 of the first main surface 701 defines a vertical direction. Directions orthogonal to the surface normal 704 are lateral and horizontal directions.

The semiconductor substrate 700 may include at least a base portion 705, an auxiliary layer 710 and a surface layer 720 vertically stacked one upon each other, wherein the auxiliary layer 710 may separate the surface layer 720 and the base portion 705. An exposed top surface of the surface layer 720 forms the first main surface 701 of the semiconductor substrate 700. The semiconductor substrate 700 may include further layers between the base portion 705 and the second main surface 702. The surface layer 720, the auxiliary layer 710 and the base portion 705 may have the same conductivity type. For example, the surface layer 720, the auxiliary layer 710 and the base portion 705 may be n-doped. The auxiliary layer 710 may include, for example arsenic (As), phosphorus (P), nitrogen (N) and/or antimony (Sb) atoms. The auxiliary layer 710 may be homogenously doped or may show a non-uniform vertical dopant profile. The auxiliary layer 710 may show a lateral substantially uniform dopant distribution. A minimum-dopant concentration in the auxiliary layer 710 is at least $10^{18}$ cm$^{-3}$, for example at least $10^{19}$ cm$^{-3}$. The auxiliary layer 710 may have a first vertical extension v1 in a range from 0.5 µm to 10 µm, for example in a range from 5 µm to 8 µm.

A mean net dopant concentration in the base portion 705 may be equal to or lower than in the auxiliary layer 710, for example at most 50% or at most 10% of the mean dopant concentration in the auxiliary layer 710.

A second vertical extension v2 of the surface layer 720 may be in a range from 50 nm to 2 µm, for example in a range of 100 nm to 500 nm. A mean net dopant concentration in the surface layer 720 may be at most $5 \times 10^{17}$ cm$^{-3}$, or at most $10^{17}$ cm$^{-3}$. The surface layer 720 may include the same dopant elements as the auxiliary layer 710 at the same concentration, wherein the surface layer 720 may further include p-type dopants and/or atoms forming deep dopants, for example, vanadium (V) and/or titanium (Ti). At least a portion of the auxiliary layer 710 and a portion of the surface layer 720 are porosified and converted (and/or transformed) into a porous structure 820 by anodic dissolution.

For example, the semiconductor substrate is electrochemically etched in hydrofluoric acid (HF) under conditions leading to local anisotropic dissolution of the semiconductor material by anodic dissolution. Following an initial formation of pits at the side of surface defects, pores may propagate from the pits along crystalline axes and/or current filaments. The porosification occurs mainly at an interface between the steadily formed porous layer and the underlying semiconductor material. In this way, a porous layer forms that originates from the first main surface 701 and that increases in thickness as the etch progresses.

Figure 1B:
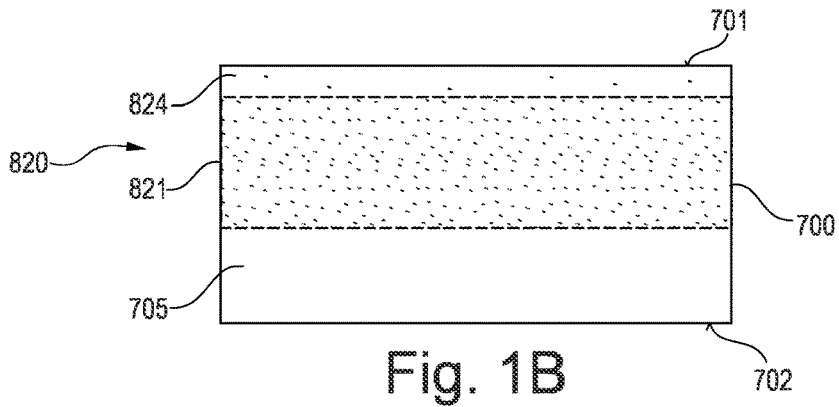

FIG. 1B shows the porous structure 820 resulting by porosifying the auxiliary layer 710 and the surface layer 720 of FIG. 1A. The porous structure 820 includes a coarse-porous layered portion 821 formed from the auxiliary layer 710 of FIG. 1A and a fine-porous portion 824 formed from the surface layer 720 of FIG. 1A. Due to the lower dopant concentration in the surface layer 710 the anodic dissolution forms less and/or smaller pores in the surface layer 720 than in the auxiliary layer 710. The overall porosity of the coarse-porous layered portion 821 is significantly greater than the overall porosity of the fine-porous portion 824.

Porosification not necessarily stops at a transition between the auxiliary layer 710 and the base portion 705. For example, a horizontal layer portion of the auxiliary layer 710 may be porosified (e.g., only the horizontal layer portion may be porosified), wherein the process of porosification does not reach the base portion 705. Alternatively and/or additionally, in addition to the auxiliary layer 710, a horizontal layer portion of the base portion 705 may be porosified, wherein the porosified horizontal layer portion of the base portion 705 is in contact (e.g., direct contact) with the porosified auxiliary layer 710. An epitaxial layer 730 is formed on the porous structure 820. Forming the epitaxial layer 730 may include CVD (chemical vapor deposition).

Figure 1C:
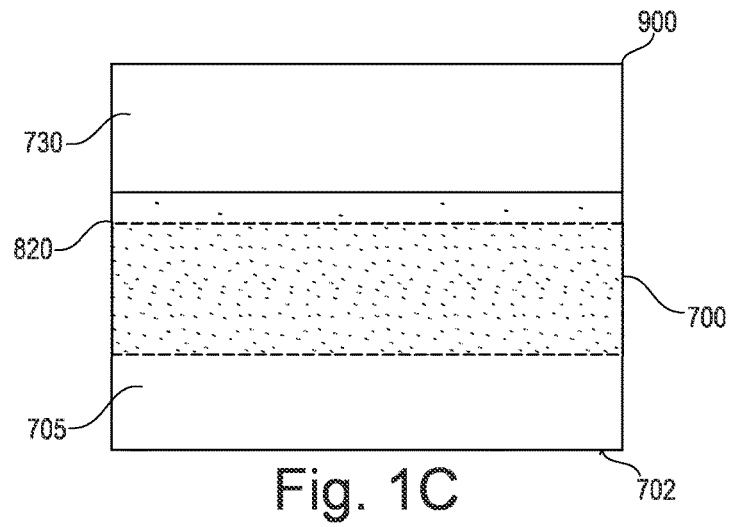

FIG. 1C shows a wafer composite 900 that includes the epitaxial layer 730, the porous structure 820, and the base portion 705. The epitaxial layer 730 is formed on the fine-porous portion 824 (e.g., directly on the fine-porous portion 824). Due to the small cross-sectional area and/or low density of pores in the fine-porous portion 824, the epitaxial layer 730 may grow with high crystal quality and at comparatively low lattice defect density. The fine-porous portion 824 is sufficiently thick such that it forms a continuous, thermally stable and solid seed layer during the epitaxy.

In the epitaxial layer 730 semiconducting portions of semiconductor devices may be formed. For example, doped regions of a power semiconductor diode or a power semiconductor switch may be formed in the epitaxial layer 730. In this context, a power semiconductor device or a power switch is an electronic device that can continuously conduct a load current of at least 0.5 A (e.g., at least 5 A) and that is able to permanently block voltages of at least 100 V, for example, at least 600 V.

Then the porous structure 820 may be horizontally separated, e.g., by applying a shear force, wherein the epitaxial layer 700 is separated from the base portion 705.

Figure 1D:
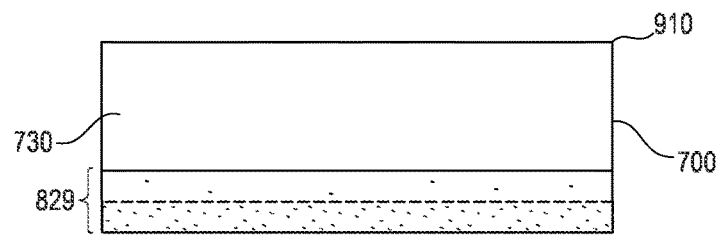

FIG. 1D shows an epitaxial wafer 910 obtained by separation from the base portion 705 of FIG. 1C. The epitaxial wafer 910 includes the epitaxial layer 730 and porous residuals 829 of the porous structure 820 of FIG. 1C. The porous residuals 829 may be completely or partly removed or may get part of semiconductor dies obtained from the epitaxy wafer 910 by wafer dicing.

The surface of the base portion 805 of FIG. 1C may be polished, lapped and/or grinded after separation to partially or fully remove residuals of the porous structure 820. New auxiliary and surface layers may be formed in the base portion 805, wherein the base portion 805 may be used several times as donor substrate.

FIGS. 2A to 5C illustrate different masks 410 for laterally restricting the porosification of a portion of a semiconductor substrate 700 in a portion below (e.g., directly below) a first main surface 701.

Figure 2A:
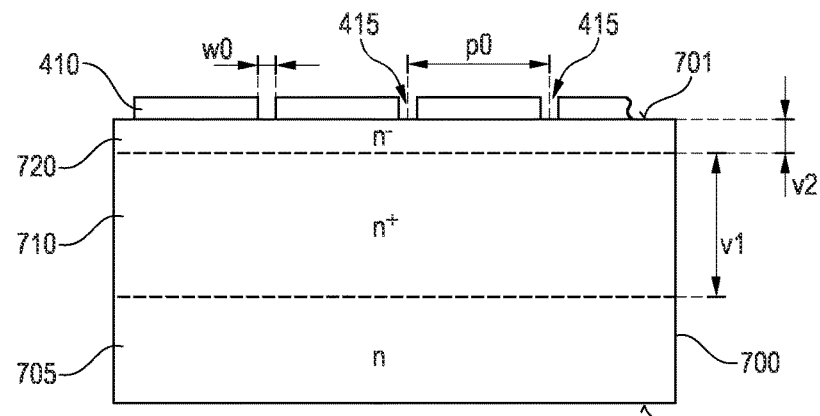
FIGS. 2A-2C show schematic vertical cross-sectional views of portions of a semiconductor substrate and a wafer composite for illustrating a semiconductor device manufacturing method according to an embodiment using laterally separated fine-porous columnar structures.

FIG. 2A shows a semiconductor substrate 700 with a weakly doped surface layer 720 between the first main surface 701 and a more heavily doped auxiliary layer 710 as described above. The semiconductor substrate 700 may be a silicon carbide substrate.

A mask 410 with mask openings 415 covers portions of the first main surface 701. The mask openings 415 may be stripes with a horizontal longitudinal axis orthogonal to the cross-sectional plane or may be dot-shaped with approximately circular or approximately polygonal horizontal cross-section. A width w0 or diameter of the mask openings 415 may be in a range from 50 nm to 200 nm, for example, about 100 nm. A center-to-center distance p0 between neighboring mask openings 415 may be in a range from 0.2 μm to 10 μm, for example from 2 μm to 6 μm.

The mask openings 415 may be uniformly distributed across the main surface 701. Alternatively and/or additionally, the mask openings may be predominantly or exclusively formed in a kerf region, wherein the kerf region laterally separates productive chip regions from which semiconductor dies are obtainable by wafer dicing. The mask material may be silicon nitride, by way of example.

The auxiliary layer 710 and portions of the surface layer 720 are porosified by anodic dissolution in hydrofluoric acid, wherein during electrochemical etching the mask 410 covers portions of the first main surface 701.

Figure 2B:
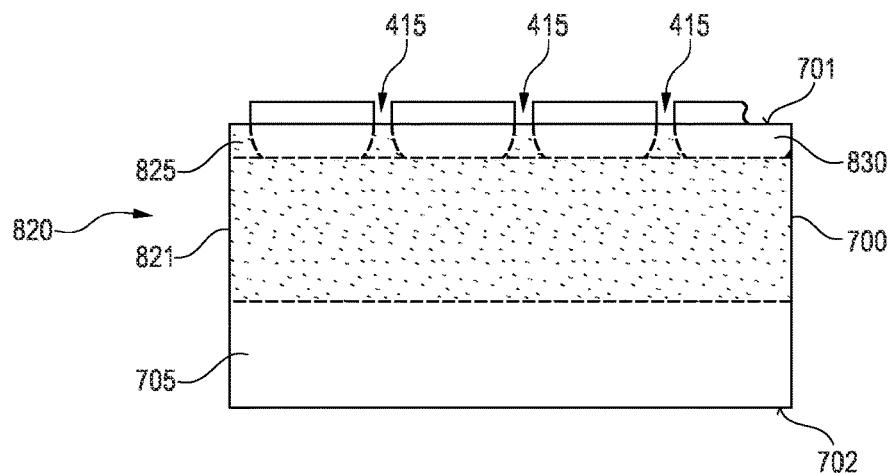

FIG. 2B shows that the porosified auxiliary layer 710 forms a coarse-porous layered portion 821 and that the porosified portions of the surface layer 720 of FIG. 2A form fine-porous columnar portions 825 extending between the first main surface 701 and the coarse-porous layered portion 821 below the mask openings 415. The mask 410 shields portions of the surface layer 720 covered by the mask 410 against the electrolyte such that non-porosified portions of the surface layer 720 of FIG. 2A form non-porous portions 830 between the fine-porous columnar portions 825.

The mask 410 may be removed and a CVD process may form an epitaxial layer 730 on the first main surface 701. At the beginning of the deposition process, the non-porous portions 830 and the fine-porous columnar portions 824 form a sufficiently thick and stable seed layer that facilitates the growing of an epitaxial layer 730 with low defect density.

Figure 2C:
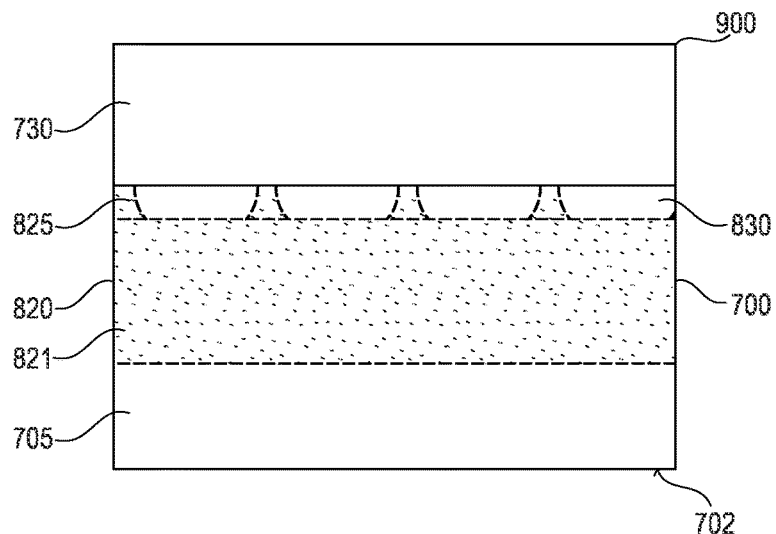

FIG. 2C shows a wafer composite 900 including the epitaxial layer 730, the porous structure 820, and the base portion 805. The porous structure 820 includes a coarse-porous layered portion 821 and fine-porous columnar portions 825 extending from the layered portion 821 to the epitaxial layer 730. Non-porous portions 830 are laterally between the columnar portions 825. The coarse-porous layered portion 821 and the fine-porous columnar portions 825 have different net dopant concentrations.

At a later stage the epitaxial layer 730 may be separated from the base portion 705 along the porous structure 820, for example, by separating along a horizontal separation plane through the coarse-porous layered portion 821.

Figure 3A:
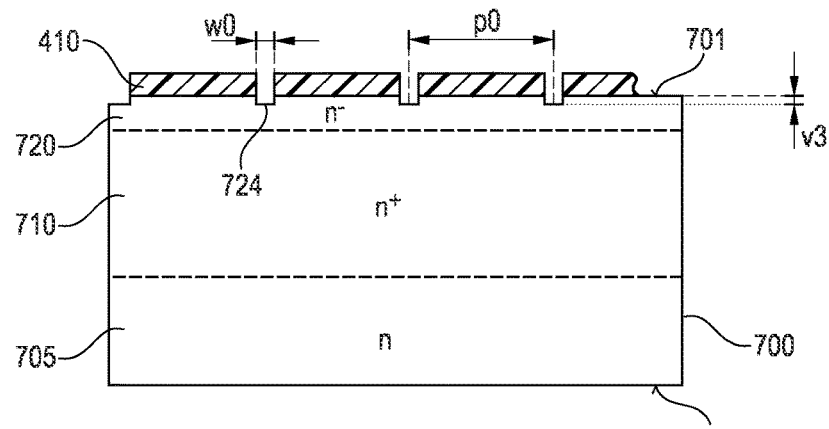
FIGS. 3A-3C show schematic vertical cross-sectional views of portions of a semiconductor substrate and a wafer composite for illustrating a semiconductor device manufacturing method according to an embodiment using pits for forming laterally separated fine-porous columnar structures.
Figure 3B:
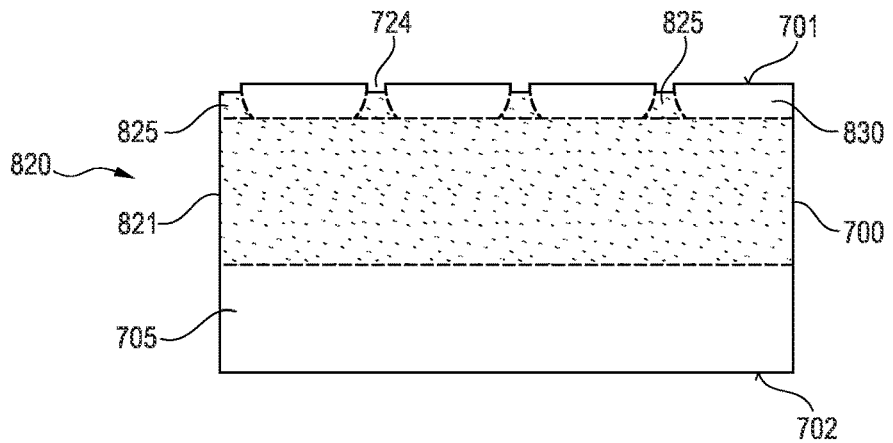
Figure 3C:
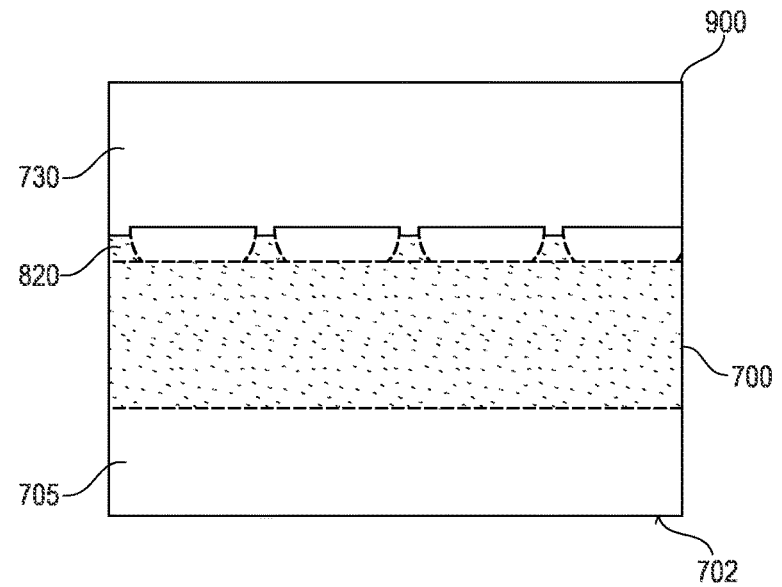

FIGS. 3A to 3C show a method of controlling position and a lateral extension of fine-porous columnar portions 825 in a lightly doped surface layer 720 by forming pits 724 in the first main surface 701.

FIG. 3A shows a mask 410 formed on the first main surface 701. Mask openings 415 in the mask 410 may have the same width and center-to-center distance as in the mask 410 of FIG. 2A. The material of the mask 410 in FIG. 3A is not necessarily selected to be not consumed during anodic etching. For example, the mask 410 of FIG. 3A may be based on a resist material. The mask 410 masks an etching of the semiconductor substrate 700. The etching may be a wet etch or an anisotropic etch, e.g., RIE (reactive ion etching). The etch forms pits 724 in the first main surface 701. A third vertical extension v3 of the pits 724 may be in a range from 0.1 μm to 5 μm, for example, from 0.5 μm to 1 μm.

The mask 410 may be removed. The auxiliary layer 710 and portions of the surface layer 720 may be porosified by anodic dissolution. Since the electric resistance of the surface layer 720 in sections below the pits 724 is lower than between the pits 724, electric field and current density is higher below the pits 724. Porosification of the surface layer 720 predominantly starts at the bottom of the pits 724 and proceeds from the pits 724 in direction of the second main surface 702.

As shown in FIG. 3B the resulting porous structure 820 includes a coarse-porous layered portion 821 resulting from the auxiliary layer 710 of FIG. 3A and includes fine-porous columnar portions 825 extending from the pits 724 to the coarse-porous layered portion 821. Non-porous portions 830 are formed laterally between the columnar portions 825. A CVD process may form an epitaxial layer 730 on the first main surface 701.

FIG. 3C shows a wafer composite 900 with the epitaxial layer 730 formed on the porous structure 820 of FIG. 3B. Later the epitaxial layer 730 may be split off from the base portion 705 along a horizontal separation plane through the porous structure 820.

Figure 4A:
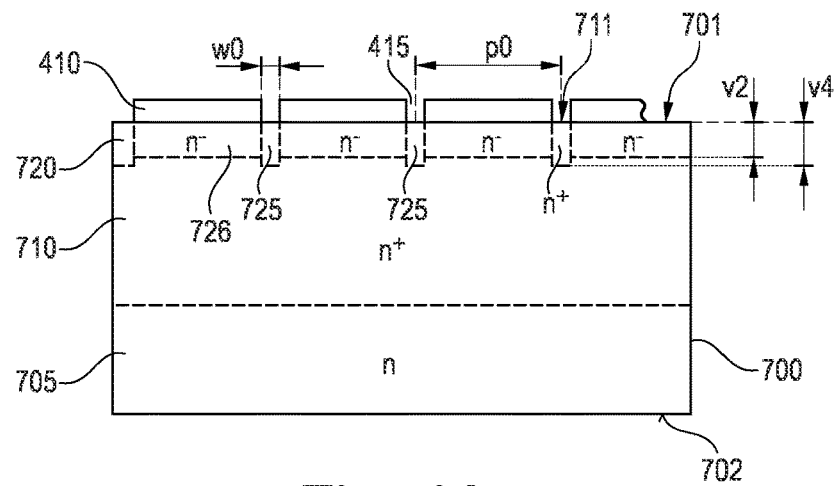
FIGS. 4A-4C show schematic vertical cross-sectional views of portions of a semiconductor substrate and a wafer composite for illustrating a semiconductor device manufacturing method according to an embodiment using a masked implant of dopants for forming laterally separated fine-porous columnar structures.
Figure 4B:
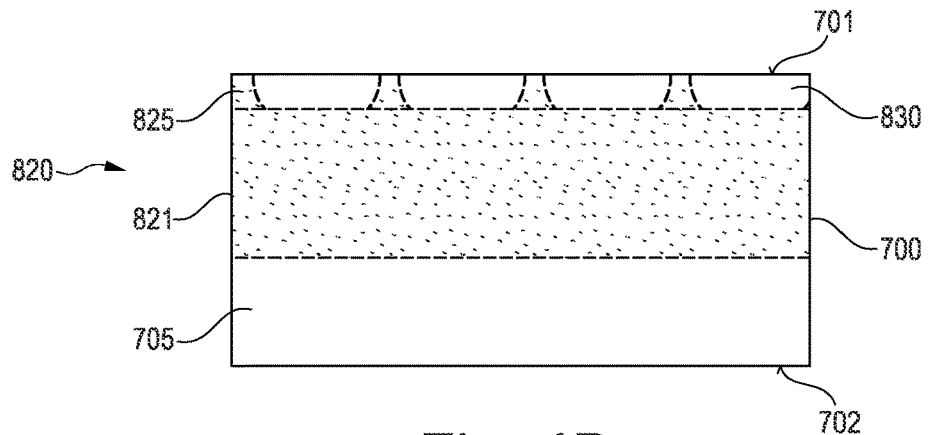
Figure 4C:
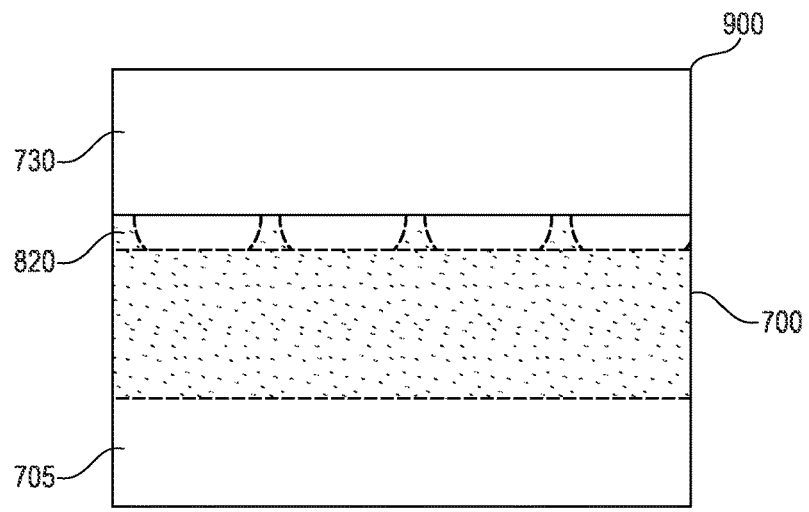

In FIGS. 4A to 4C a mask 410 exposes first sections 711 of the first main surface 701. Mask openings 415 in the mask 410 may have the same width and center-to-center distance as in the mask 410 of FIG. 2A. Dopants are implanted through the mask openings 415.

The implanted dopants may form auxiliary regions 725 below (e.g., directly below) the mask openings 415. A fourth vertical extension v4 of the auxiliary regions 725 may be smaller than, equal to or greater than the second vertical extension v2 of the surface layer 729. The auxiliary regions 725 may have a higher electrochemical dissolution efficiency than masked regions 726 of the surface layer 720 and a lower electrochemical dissolution efficiency than the auxiliary layer 710. For example, the net dopant concentration in the auxiliary regions 725 may be higher, e.g., at least twice as high as in the masked regions 726 and lower than in the auxiliary layer 710.

The mask 410 may be removed and the auxiliary layer 710 and the auxiliary regions 725 may be porosified by anodic dissolution.

FIG. 4B shows a porous structure 820 including a coarse-porous layered portion 821 resulting from the auxiliary layer 710 of FIG. 4A and columnar portions 825 resulting predominantly from the auxiliary regions 725 of FIG. 4A. A CVD process may form an epitaxial layer 730 on the first main surface 701.

FIG. 4C shows a wafer composite 900 with the epitaxial layer 730 formed on the porous structure 820 of FIG. 4B. Later the epitaxial layer 730 may be split off from the base portion 705 along a horizontal separation plane through the porous structure 820.

Figure 5A:
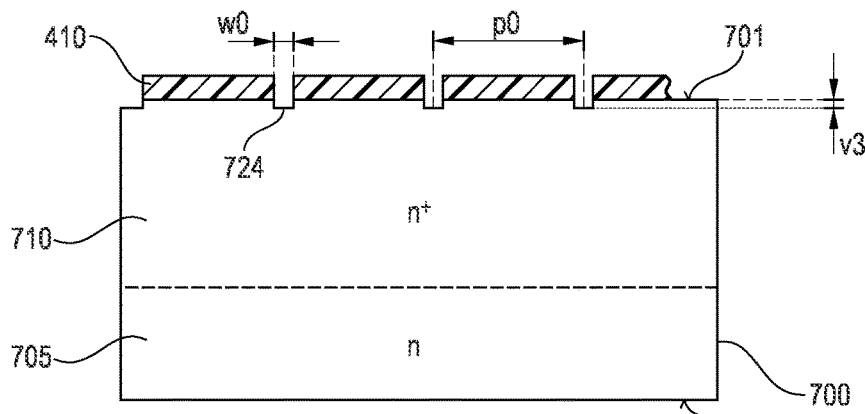
FIGS. 5A-5C show schematic vertical cross-sectional views of portions of a semiconductor substrate and a wafer composite for illustrating a semiconductor device manufacturing method according to an embodiment using pits for forming laterally separated fine-porous columnar structures.
Figure 5B:
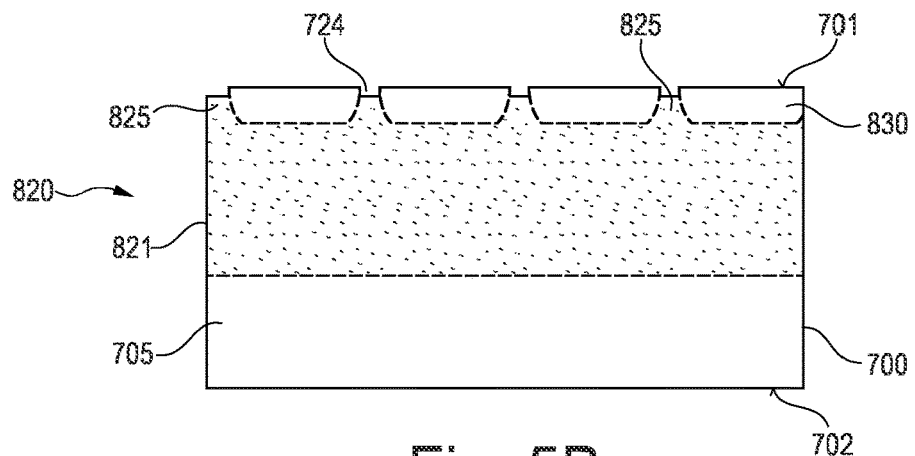
Figure 5C:
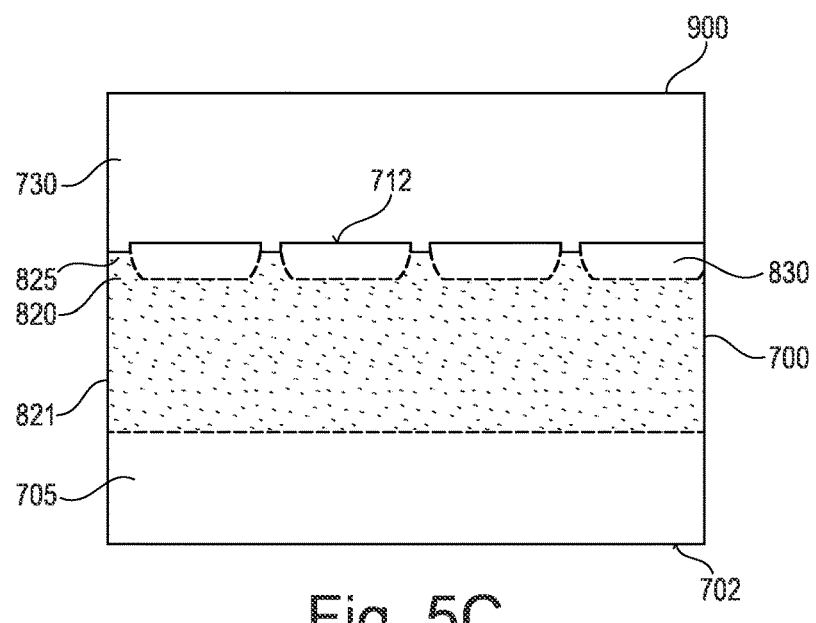

FIGS. 5A to 5C refer to an embodiment with an auxiliary layer 710 extending from the first main surface 701 to the base portion 705.

FIG. 5A shows a mask 410 as described above to form pits 724 in the first main surface 701. The mask 410 is removed and the auxiliary layer 710 is porosified by anodic dissolution.

According to FIG. 5B the auxiliary layer 710 of FIG. 5A is converted (and/or transformed) into a porous structure 820 with a coarse-porous layered portion 821 and with fine-porous columnar portions 825 extending from the pits 724 to the layered portion 821. An epitaxial layer 730 is formed on the first main surface 701.

FIG. 5C shows a wafer composite 900 with the epitaxial layer 730 formed on the porous structure 820 of FIG. 5B. The columnar portions 825 and non-porous portions 830 formed between the columnar portions 825 may have the same dopant concentration as the layered portion 821.

The method may be applied to semiconductor substrates 700 from semiconductor materials that form self-ordered nanopores in a thin skin layer along the first main surface 701 during electrochemical dissolution, for example, for a semiconductor substrate 700 based on silicon carbide.

Figure 6:
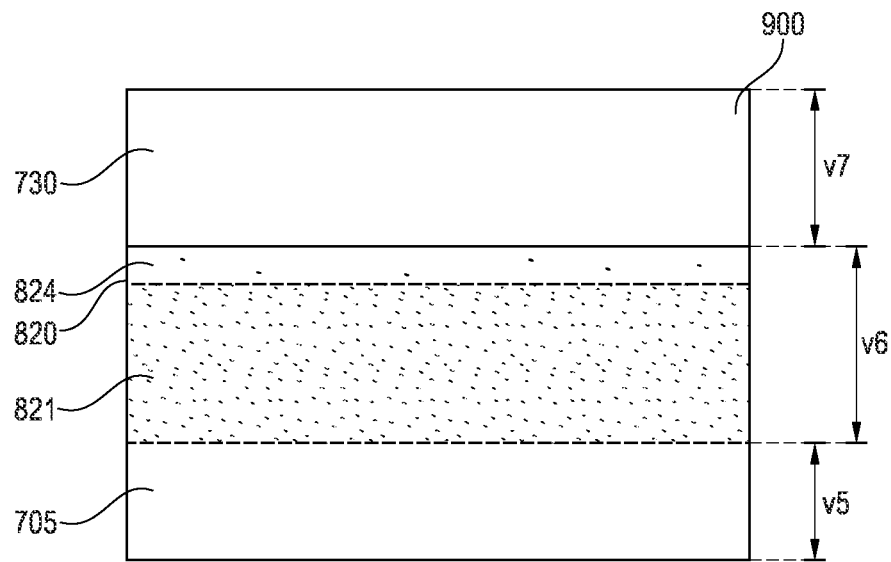
FIG. 6 shows a schematic vertical cross-sectional view of a wafer composite according to an embodiment with an epitaxial layer on a fine-porous layer.
Figure 7:
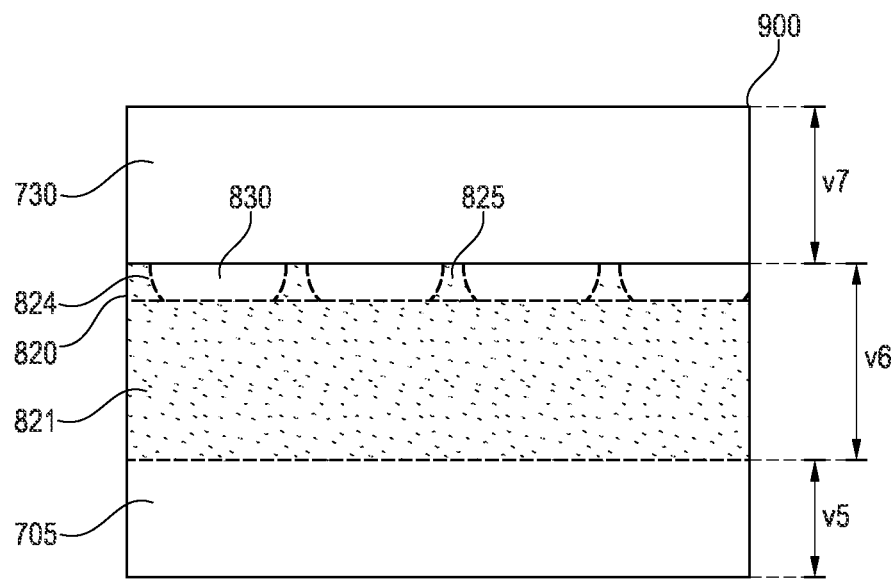
FIG. 7 shows a schematic vertical cross-sectional view of a wafer composite according to an embodiment with laterally separated fine-porous columnar portions.

FIGS. 6 and 7 show wafer composites 900 with porous structures 820 horizontally extending through a complete cross-section of the wafer composite 900.

Each wafer composite 900 includes a base portion 705, a porous structure 820 formed on the base portion 705 and an epitaxial layer 730 formed on the porous structure 820.

The material of the base portion 705 may be a first semiconducting material, for example, an elementary semiconductor or a compound semiconductor, for example a IV/IV compound semiconductor material. A fifth vertical extension v5 of the base portion 705 may be in the range of several hundred μm to several mm.

The porous structure 820 may include a fine porous portion 824 and a coarse-porous layered portion 821. A sixth vertical extension v6 of the porous structure 820 may be in the same range as the sum of the first vertical extension v1 and the second vertical extension v2 in FIG. 1A.

At least the layered portion 821 laterally extends across the complete horizontal cross-sectional area of the wafer composite 900. The porosity in the coarse-porous layered portion 821 may be in a range from 30% to 80%, for example, from 40% to 60%.

Apart from the pores, the crystal lattice of the semiconductor material in the layered portion 821 forms a single-crystalline lattice skeleton.

For example, the porous structure 820 is based on silicon carbide and a minimum dopant concentration in the coarse-porous layered portion 821 is greater than $5 \times 10^{18}$ cm$^{-3}$, for example at least $5 \times 10^{19}$ cm$^{-3}$, for example, about $10^{20}$ cm$^{-3}$ or higher. A vertical extension of the coarse-porous layered portion 821 may be in a range from 1 μm to 10 μm, by way of example.

The fine-porous portion 824 has at most 50%, for example at most 20% of the porosity of the coarse-porous layered portion 821. For example, in the fine-porous portion 824 the pores may have a mean diameter of at most 50 nm, e.g., smaller than 40 nm. For example, the porosity of the fine-porous portion 824 is less than 20%, for example less than 10%. A vertical extension of the fine-porous portion 824 may be in a range from 100 nm to 500 nm, by way of example.

A dopant concentration in the fine-porous portion 824 may be equal to or lower than in the layered portion 821. For example, a mean net dopant concentration in the layered portion 821 is at least 100 times the mean net dopant concentration in the fine-porous portion 824. For example, the porous structure 820 is based on silicon carbide and the dopant concentration in the fine-porous portion 824 may be at most $5 \times 10^{17}$ cm$^{-3}$.

The epitaxial layer 730 may have a seventh vertical extension v7 in a range from 5 μm to several hundred μm. The epitaxial layer 730 may be uniformly doped or may include semiconducting regions for a plurality of semiconductor devices.

The epitaxial layer 730 may be from the same material as base portion 705 or from another material having a similar lattice constant. For example, the base portion 705 may be a SiC crystal, and the epitaxial layer 730 may include silicon carbide or gallium nitride, by way of example. In some embodiments, the base portion 705 may be a silicon crystal, and the epitaxial layer 730 may be a gallium nitride layer.

In FIG. 6 the fine-porous portion 824 is a horizontal layer extending in uniform thickness through a complete horizontal cross-section of the wafer composite 900. The pores may be more or less evenly distributed.

In FIG. 7 the fine-porous portion 824 includes a plurality of laterally separated columnar portions 825, wherein non-porous portions 830 are formed laterally between the columnar portions 825.

The method as described with any of FIGS. 1A-1D, 2A-2C, 3A-3C, 4A-4C and 5A-5C may be used to form any of the wafer composites 900 as described with reference to FIGS. 6 and 7. Any of the wafer composites 900 described with reference to FIGS. 6 and 7 may be obtained in course of any of the methods described with reference to FIGS. 1A-1D, 2A-2C, 3A-3C, 4A-4C and 5A-5C.

FIGS. 8A to 9B illustrate semiconductor devices 500 that include porous portions 180 close to the surface at the rear side.

The semiconductor may be single-crystalline silicon carbide, e.g. 4H-SiC (SiC of the 4H-polytype), 2H-SiC, or 6H-SiC, wherein the silicon carbide crystal may include unwanted impurities such as hydrogen, oxygen and/or fluorine and may also include intended impurities, e.g. dopant atoms. A first surface 101 of the semiconductor body 100 at the front side is parallel to an opposite second surface 102 at the rear side.

A drift structure 130 adjoins (e.g., directly adjoins) the second surface 102. The drift structure 130 may include a lightly doped drift zone 131 and a heavily doped contact portion 139 (e.g., a drain layer) between the drift zone 131 and the second surface 102, wherein the contact portion 139 may have the same conductivity type as the drift zone 131, the opposite conductivity type, or may include doped zones of both conductivity types. The doped contact portion 139 (e.g., in embodied as a drain layer) may have a vertical extension of at least 3 μm (e.g., at least 10 μm) to at most 100 μm (e.g., at most 50 μm). The doped contact portion 139 may mechanically stabilize the separated wafer.

The drift structure 130 may be electrically connected or coupled to a rear side metallization 320. For example, a dopant concentration in the contact portion 139 along the second surface 102 is sufficiently high to form a low-resistive ohmic contact between the rear side metallization 320 and the drift structure 130. In the case that the porous structure at the wafer backside is not fully removed, a lower doping concentration (which may result in a good backside contact between contact portion and metallization) may be enabled.

The drift structure 130 may include further doped regions between the drift zone 131 and the second surface 102, for example, a buffer or field stop layer 138 between the drift zone 131 and the contact portion 139. A termination structure may be formed between a central region of the semiconductor body 100 and a side surface 103 of the semiconductor body 100.

Figure 8A:
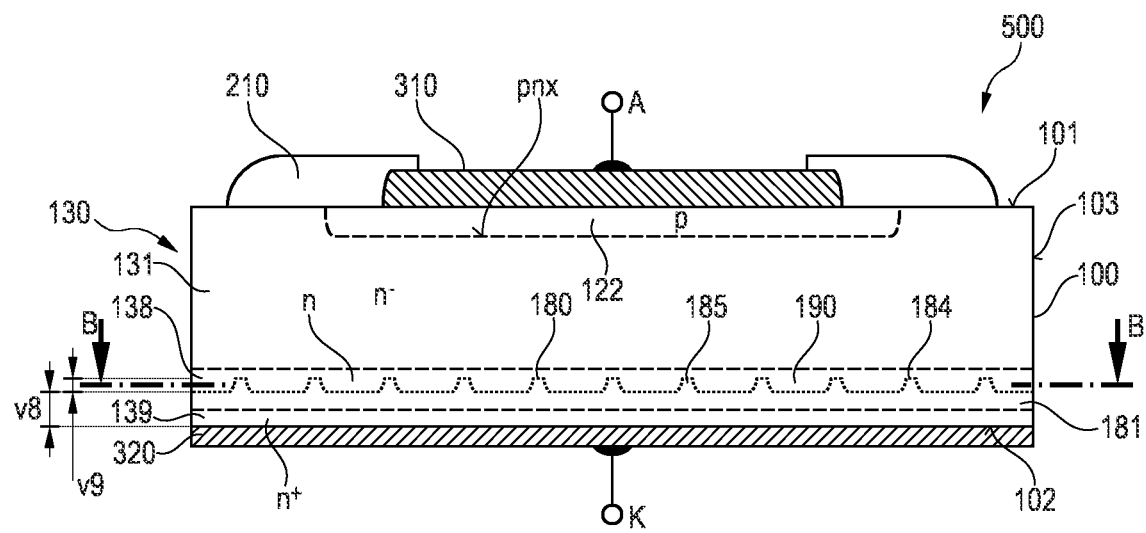
FIGS. 8A-8B show schematic vertical and horizontal cross-sectional views of a semiconductor diode with a porous portion according to an embodiment.
Figure 8B:
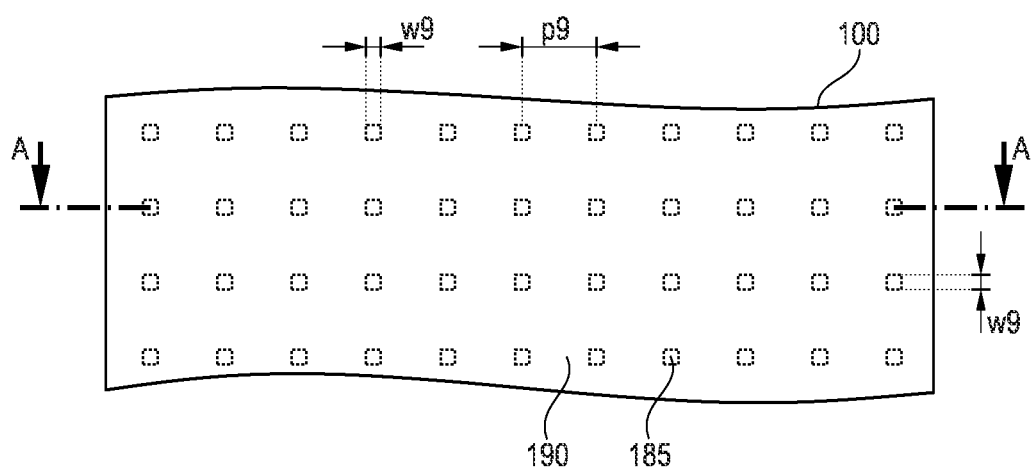

In FIGS. 8A and 8B the semiconductor device 500 is a power semiconductor diode with an anode region 122 formed in the central region at the front side of the semiconductor body 100. The anode region 122 and the drift structure 130, e.g., the anode region 122 and the drift zone 131, form a main pn junction pnx. The main pn junction pnx may include a main section substantially parallel to the first surface 101. A front side electrode 310 and the anode region 122 may form a low-resistive ohmic contact. The front side electrode 310 may form or may be electrically connected or coupled to an anode terminal A. A dielectric layer 210 may cover sidewalls of the front side metallization 310. A rear side metallization 320 may form or is electrically connected or coupled to a cathode terminal K of the semiconductor diode.

Figure 9A:
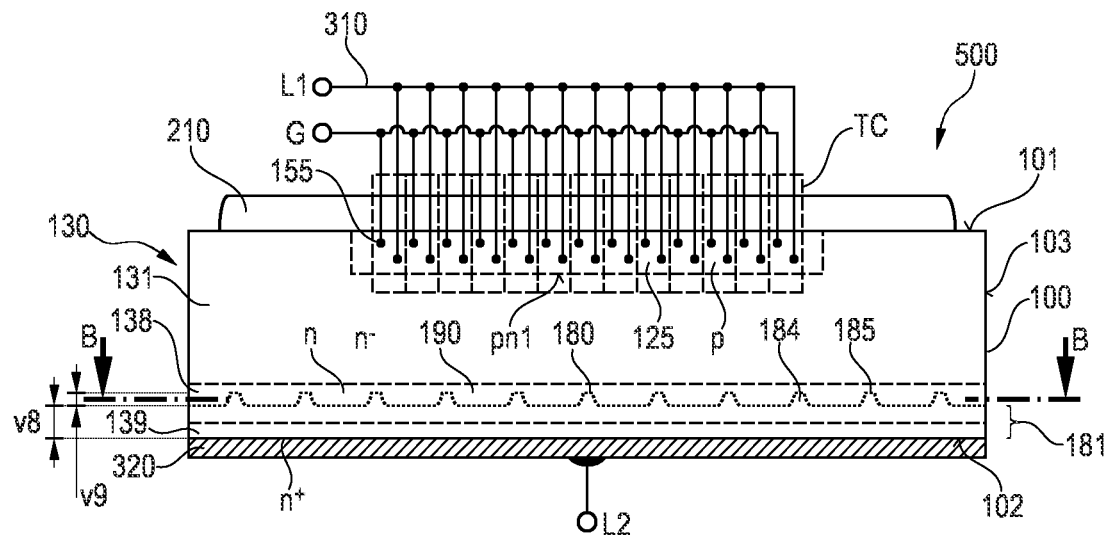
FIGS. 9A-9B show schematic vertical and horizontal cross-sectional views of a semiconductor device with transistor cells and a porous portion according to an embodiment.
Figure 9B:
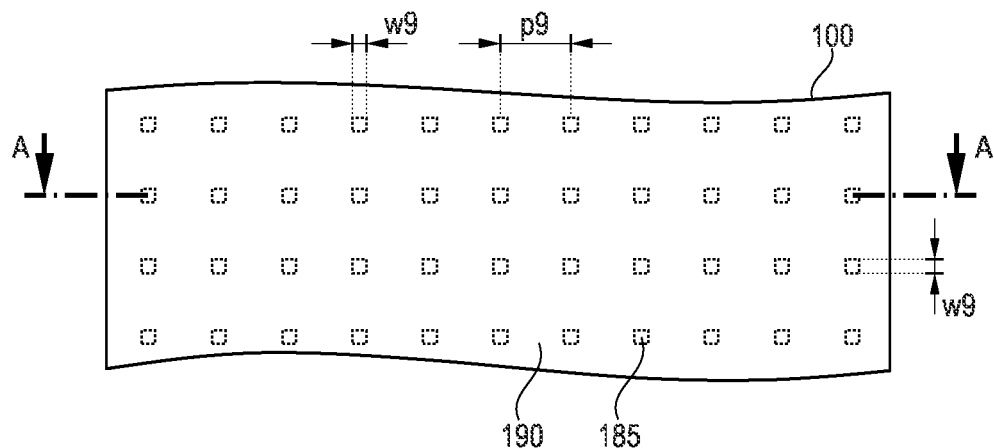

FIGS. 9A and 9B show a semiconductor device 500 including transistor cells TC in the central region. The semiconductor device 500 may be or may include an IGFET (insulated gate field effect transistor), for example an MOSFET (metal oxide semiconductor FET) in the usual meaning including FETs with metal gates as well as FETs with gates from heavily doped semiconductor material, an MCD (MOS controlled diode), or an IGBT (insulated gate bipolar transistor), by way of example. In each transistor cell TC, a body region 125 separates a source region from the drift structure 130. The body regions 125 and the drift structure 130, e.g., the body regions 125 and the drift zone 131, form first transistor pn junctions pn1. The body regions 125 and source regions of the transistor cells TC form second transistor pn junctions.

A front side electrode 310 electrically connected to the body regions 125 and the source regions may form or may be electrically connected or coupled to a first load terminal L1, which may be an anode terminal of an MCD, a source terminal of an IGFET or an emitter terminal of an IGBT. The rear side metallization 320 forms a second load electrode electrically connected to the contact portion 139, wherein the second load electrode may form or may be electrically connected or coupled to a second load terminal L2, which may be a cathode terminal of an MCD, a drain terminal of an IGFET or a collector terminal of an IGBT.

The transistor cells TC may be transistor cells with gate electrodes 155 electrically connected to a gate terminal G. The gate electrodes 155 may be planar gate electrodes or trench gate electrodes, wherein trench gate electrodes may control a lateral channel or a vertical channel. According to an embodiment, the transistor cells TC are n-channel FET cells with p-doped body regions 125, n-doped source zones and an n-doped drift zone 131.

In the semiconductor devices 500 of FIGS. 8A to 9B, the semiconductor body 100 includes a porous portion 180, which may be in contact with (e.g., may comprise or may be part of) the second surface 102. The porous portion 180 includes a coarse-pored layer portion 181 and a fine-pored portion 184. The fine-pored portion 184 may be a layer of uniform thickness or may include a plurality of laterally separated column portions 185 extending from the layer portion 181 in direction of the first surface 101. The porous portion 180 may exclusively overlap with the contact portion 139, may further overlap with the buffer or field stop layer 138 or with a drain layer or may even overlap with the drift zone 131.

An eighth vertical extension v8 of the layer portion 181 may be in a range from 100 nm to 10 μm, for example, from 500 nm to 5 μm. A ninth vertical extension v9 of the column portions 185 may in the range from 100 nm to 500 nm. A mean center-to-center distance p9 between neighboring column portions 185 may be in a range from 200 nm to 5 μm. A horizontal width w9 of the column portions 185 may be in a range from 100 nm to 2 μm. Non-porous sections 190, which may stripe-shaped or which may form a grid, may laterally separate the column portions 185.

The porosity of the column portions 185 may differ from the porosity of the layer portion 181. For example, a total porosity and/or a mean pore size in the column portions 185 are lower than in the layer portion 181. The column portions 185 may be fine-porous. The layer portion 181 may be coarse-porous.

The porous portion 180 may reduce mechanical stress between the rear side metallization 320 and the drift zone 131, may reduce the contact resistance between a contact zone and the backside metallization, and/or may provide getter sites for impurities, e.g., metal atoms and/or may be used to tune device parameters such as short-circuit ruggedness. Alternatively and/or additionally, the column portions 185 may locally increase a charge carrier recombination rate for improving switching characteristics of the semiconductor device 500.

The method as described with any of the FIGS. 1A-1D, 2A-2C, 3A-3C, 4A-4C and 5A-5C may be used to form any of the semiconductor devices 500 as described with reference to FIGS. 8A-8B and 9A-9B. Any of the semiconductor devices 500 described with reference to FIGS. 8A-8B and 9A-9B may be obtained by any of the methods described with reference to FIGS. 1A-1D, 2A-2C, 3A-3C, 4A-4C and 5A-5C.

What is claimed is:

1. A method of manufacturing a semiconductor device, comprising:
   providing a semiconductor substrate, wherein the semiconductor substrate comprises a base portion, an auxiliary layer on the base portion, and a surface layer on the auxiliary layer;
   forming pits in the surface layer; and
   converting at least a portion of the auxiliary layer into a porous structure, wherein the porous structure comprises a layered portion formed at a distance to a first main surface of the semiconductor substrate, and wherein laterally separated columnar portions extend from the pits to the layered portion.

2. The method according to claim 1, comprising:
   forming, after the converting, an epitaxial layer on the first main surface.

3. The method according to claim 2, comprising:
   separating the epitaxial layer from the base portion along the layered portion.

4. The method according to claim 1, wherein
   forming pits in the surface layer is performed such that a vertical extension of the pits is in a range from 0.1 μm to 5 μm.

5. The method according to claim 1, wherein
   providing the semiconductor substrate is performed such that a vertical extension of the surface layer is in a range from 50 nm to 2 μm.

6. A method of manufacturing a semiconductor device, comprising:
   forming a base portion;
   forming a coarse-porous layered portion on the base portion, wherein a portion with a first porosity is on the coarse-porous layered portion;
   forming a first fine-porous columnar portion, with a second porosity greater than the first porosity, on a first portion of the coarse-porous layered portion; and
   forming a second fine-porous columnar portion, with a third porosity greater than the first porosity, on a second portion of the coarse-porous layered portion, wherein the portion on the coarse-porous layered portion is between the first fine-porous columnar portion and the second fine-porous columnar portion,
   wherein an epitaxial layer is on the first fine-porous columnar portion, the portion on the coarse-porous layered portion and the second fine-porous columnar portion.

7. The method according to claim 6, wherein
   the first porosity of the portion on the coarse-porous layered portion is between zero and 10% of at least one of the second porosity of the first fine-porous columnar portion or the third porosity of the second fine-porous columnar portion.

8. The method according to claim 6, wherein
   forming the first fine-porous columnar portion is performed such that the first fine-porous columnar portion is in contact with a first surface of the portion on the coarse-porous layered portion.

9. The method according to claim 8, wherein
   forming the second fine-porous columnar portion is performed such that the second fine-porous columnar portion is in contact with a second surface of the portion on the coarse-porous layered portion.

10. The method according to claim 6, wherein
    forming the coarse-porous layered portion is performed such that the coarse-porous layered portion comprises a compound semiconductor.

11. The method according to claim 6, wherein
    forming the coarse-porous layered portion is performed such that the coarse-porous layered portion comprises at least one of gallium arsenide (GaAs), gallium nitride (GaN), silicon germanium (SiGe) or silicon carbide (SiC).

12. A method of manufacturing a semiconductor device, comprising:
    forming a first fine-porous columnar portion, with a second porosity greater than a first porosity of a portion on a coarse-porous layered portion, on a first portion of the coarse-porous layered portion; and
    forming a second fine-porous columnar portion, with a third porosity greater than the first porosity, on a second portion of the coarse-porous layered portion, wherein the portion on the coarse-porous layered portion is between the first fine-porous columnar portion and the second fine-porous columnar portion,
    wherein an epitaxial layer is on the first fine-porous columnar portion, the portion on the coarse-porous layered portion and the second fine-porous columnar portion.

13. The method according to claim 12, wherein
    the first porosity of the portion on the coarse-porous layered portion is between zero and 10% of at least one of the second porosity of the first fine-porous columnar portion or the third porosity of the second fine-porous columnar portion.

14. The method according to claim 12, wherein
    forming the first fine-porous columnar portion is performed such that the first fine-porous columnar portion is in contact with a first surface of the portion on the coarse-porous layered portion.

15. The method according to claim 14, wherein
    forming the second fine-porous columnar portion is performed such that the second fine-porous columnar portion is in contact with a second surface of the portion on the coarse-porous layered portion.

16. The method according to claim 12, comprising:
    forming the coarse-porous layered portion such that the coarse-porous layered portion comprises a compound semiconductor.

17. The method according to claim 12, comprising:
    forming the coarse-porous layered portion such that the coarse-porous layered portion comprises gallium arsenide (GaAs).

18. The method according to claim 12, comprising:
    forming the coarse-porous layered portion such that the coarse-porous layered portion comprises gallium nitride (GaN).

19. The method according to claim 12, comprising:
    forming the coarse-porous layered portion such that the coarse-porous layered portion comprises silicon germanium (SiGe).

20. The method according to claim 12, comprising:
    forming the coarse-porous layered portion such that the coarse-porous layered portion comprises silicon carbide (SiC).

* * * * *